United States Patent [19]

Bouley

[11] Patent Number: 4,707,052
[45] Date of Patent: Nov. 17, 1987

[54] TULIP-SHAPED IC SOCKET CONTACT

[75] Inventor: Jean C. Bouley, Dole, France

[73] Assignee: Amphenol Corporation, Wallingford, Conn.

[21] Appl. No.: 838,634

[22] Filed: Mar. 11, 1986

[30] Foreign Application Priority Data

Mar. 27, 1985 [FR] France ................. 85 04554

[51] Int. Cl.$^4$ ............................. H01R 9/00
[52] U.S. Cl. ..................... 439/844; 439/69; 439/83
[58] Field of Search ............ 339/258 R, 258 P, 17 CF

[56] References Cited

U.S. PATENT DOCUMENTS

| | | | |
|---|---|---|---|
| 3,543,220 | 11/1970 | Jones | 339/91 |
| 3,853,389 | 12/1974 | Occhipinti | 339/258 R |
| 3,975,072 | 8/1976 | Ammon | 339/17 CF |
| 4,025,148 | 5/1977 | Bouley | 339/17 CF |
| 4,040,177 | 8/1977 | Beeler et al. | 29/630 C |
| 4,433,482 | 2/1984 | Fairbairn et al. | 29/882 |
| 4,534,603 | 8/1985 | Brown et al. | 339/258 R |
| 4,606,599 | 8/1986 | Grant et al. | 339/258 R |

FOREIGN PATENT DOCUMENTS

| | | |
|---|---|---|
| 0128794 | 12/1984 | European Pat. Off. . |
| 2536343 | 2/1977 | Fed. Rep. of Germany . |
| 2322465 | 5/1978 | France . |

Primary Examiner—Gil Weidenfeld
Assistant Examiner—Daniel W. Howell
Attorney, Agent, or Firm—Bacon & Thomas

[57] ABSTRACT

An electrical contact of the tulip type for receiving legs of an integrated circuit or similar component. The contact has a tubular body produced by cold forming and has two parallel walls of small thickness through which are punched two tabs of substantially rectangular shape. The tabs face each other and converge towards the bottom of the tubular body. The walls of small thickness are connected by walls of larger thickness. When mounted in an insulating block, the contacts are oriented with the thinner walls parallel to the longitudinal axis of the block, and the longer side of the legs of the component to be received in the block are similarly arranged.

10 Claims, 8 Drawing Figures

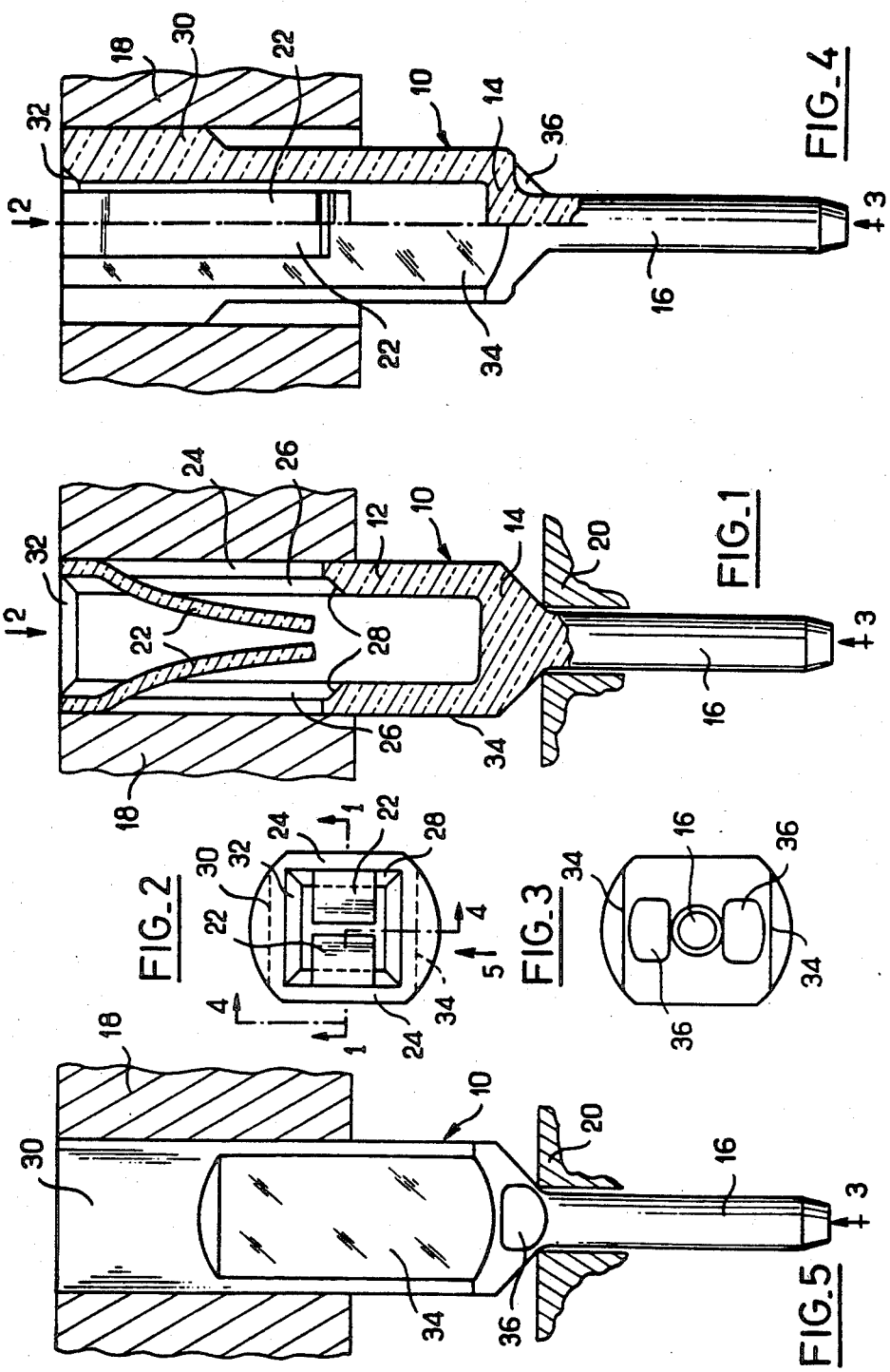

TULIP-SHAPED IC SOCKET CONTACT

BACKGROUND OF THE INVENTION

1. Field of the Invention

This invention relates to a contact of the tulip type for receiving an integrated circuit (IC) component.

2. Description of the Prior Art

A contact of the tulip type for supporting an integrated circuit or similar plug-in component generally comprises a tubular body having a closed end forming a bottom connected to a terminal provided to electrically cooperate with the hole of a printed circuit board, and an open end adapted to receive a leg of the integrated circuit which cooperates with a spring that ensures that electrical contact.

In certain existing tulip contacts, the contact in essence consists of a spring element fitted in the tubular body. This element is produced by cutting off or by rolling a metal strip of high elastic limit. Such a spring will make a contact with four or six independent sides with no preferred orientation relative to the section of the component to be connected. The contact with a pin of circular section is generally acceptable, but the contact with a rectangular section pin can be much less so. Another drawback of the inserted spring element contact is the risk of obtaining a poor connection, mechanical or electrical, between the spring and the tubular body. Furthermore, such a contact does not permit good surface treatment of the sides of the contact spring.

French Pat. No. 2,322,465 proposes a tulip contact designed in particular to receive component legs having a rectangular section, in which the electrical contact is enhanced by a transverse constriction that receives the leg and offsets it at an angle to induce torsion as it is inserted. This contact has the drawback that it cannot receive legs of dimensions slightly out of tolerance. Moreover, electrodeposition treatment of the contact surfaces is difficult.

The tulip contacts described above are generally produced by a stamping operation and are of cylindrical configuration. There presently exist machines that can make such parts by a process known as "cold forming" or "impact drawing". Such a process is described in European patent application 0,128,794. This process results in tubular elements which are not strictly cylindrical in shape.

It would be desirable to provide a tulip-shaped contact for receiving an integrated circuit which overcomes the above disadvantages.

SUMMARY OF THE INVENTION

In accordance with this invention, there is provided an electrical contact of the tulip type for supporting an integrated circuit or similar component and comprising a tubular body a closed end of which forming a bottom is connected to a terminal provided to electrically cooperate with a hole of a printed circuit board and an open end of which is provided to receive a leg of said component which cooperates with a spring providing the electrical contact, characterized in that the tubular body is obtained by cold forming and comprises two parallelly extending walls having a small thickness through which are punched two tabs of substantially rectangular shape extending to face one another and converging towards the bottom of the body, the walls of small thickness being connected by walls having a larger thickness.

Also in accordance with this invention, there is provided in a support for receiving an integrated circuit or similar component, the support comprising an insulating block having at least one row of tulip type contacts inserted therein in a longitudinal direction, each of the contacts comprising a tubular body prolonged by a terminal adapted to electrically cooperate with a hole in a printed circuit board, the body having an open end adapted to receive a leg of the component, characterized in that each of the tulip type contacts comprises two parallelly extending walls having a small thickness through which are punched two tabs of substantially rectangular shape extending to face one another and converging towards the bottom of the body, the walls of small thickness being connected by walls having a larger thickness, each of the contacts being oriented in the insulating block with its thinner walls parallel to the longitudinal axis of the insulating block, whereby the contacts are adapted to receive rectangular shaped legs of the component in a manner such that the legs also extend parallel to the longitudinal axis.

The contact according to the invention is characterized in that the tubular body is obtained by cold forming and has two thin, parallel walls in which two tabs of substantially rectangular shape are stamped out, extending face to face and converging toward the bottom of the body, the thin walls being connected by thicker walls. The rectangular openings resulting from the stamping of the tabs preferably have a longitudinal dimension that is less than the thickness of the insulating block which receives the contact.

It will be recognized that with such a configuration, the resultant contact has a geometry favorable to the reception by insertion of integrated circuit legs having a rectangular section. Furthermore, electrodeposition treatment is easy to carry out due to the corresponding rectangular lateral openings. The tightness of the contact is obtained by the cooperation of the outer wall of the tubular body with the insulating support in which it is mounted.

This invention thus provides a support in which the plug-in legs have a preferred orientation, which was not available in existing designs.

BRIEF DESCRIPTION OF THE DRAWINGS

FIG. 1 is a sectional view of a tulip contact according to the invention.

FIG. 2 is a plan view of the contact along arrow 2 in FIG. 1.

FIG. 3 is a bottom view of the contact along arrow 3 in FIG. 1.

FIG. 4 is a side view of the contact in FIG. 1 partly cut away.

FIG. 5 is a view corresponding to that in FIG. 1, the contact being seen from the outside at 90° relative to the view in FIG. 4.

DESCRIPTION OF THE PREFERRED EMBODIMENT

Figure 6:
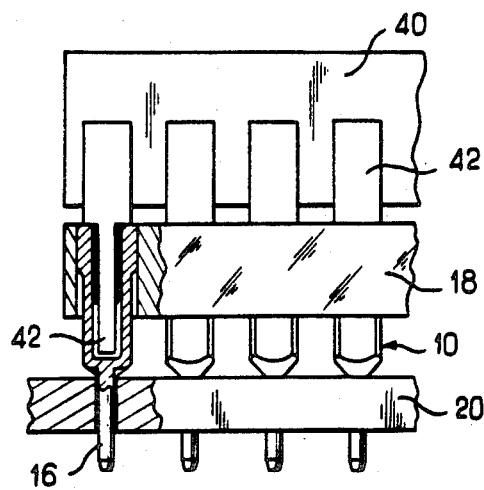
FIG. 6 shows an insulating support block in which tulip contacts according to the invention are mounted.

The tulip contact which is the subject of the invention will first be described with reference to FIGS. 1 to 5.

The contact designated by reference numeral 10 comprises a tubular body 12 whose bottom 14 is prolonged by a terminal 16. This is to ensure a mechanical connection between an insulating support block 18 and a printed card or circuit board 20. This likewise ensures an electrical connection between a leg of an integrated circuit component or the like (not shown) and the printed circuit board. In order to provide this electrical connection, two elastic tabs 22 are provided which converge towards the bottom 14 of contact 10 and are formed in one piece with tubular body 12. Tabs 22, which are generally rectangular in shape, are obtained by the shearing off from a thinner wall 24 of tubular body 12 connected by bevelled portions 26 extending longitudinally and bevelled portions 28 extending transversely to the rest of the thicker tubular body 12. Substantially level with the opening corresponding to the stamping of tabs 22, body 12 has two, still thicker, facing walls 30 which extend to the opening provided on the top of the contact to receive the leg of the integrated circuit component, whose insertion is facilitated by the presence of a bevelled surface 32 on the edge of the opening.

The presence of the reinforced portions 30 prevents the crushing or the ovalization of the tulip contact while the tabs are being sheared. It is possible to obtain different geometric forms to meet the requirements of strength of the materials by producing tubular body 12 by an operation of cold forming or impact drawing from a cylinder of metal with a high Young's modulus. An example of such material is beryllium copper. To facilitate this operation, the base of body 12 is reduced in thickness in the vicinity of the bottom 14 by flat portions 34. The cold forming operation will also produce depressions 36 forming channels for the soldering flux to rise when used with double-sided boards.

Figure 7:
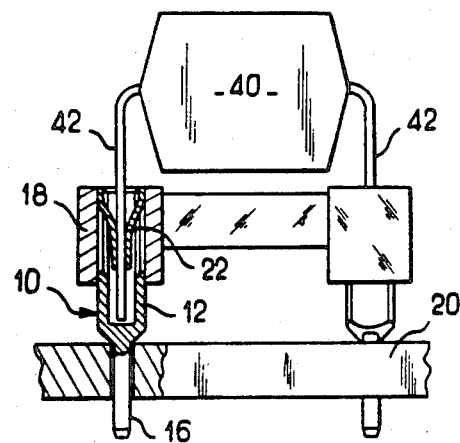
FIG. 7 shows, in profile, and partly cut away, the block in FIG. 6.

FIGS. 6 and 7 show tulip contacts 10 of the type described above mounted in the insulating block 18 and plugged into printed board 20 by their terminals 16. These figures show an integrated circuit or the like 40 whose legs 42 with rectangular section are plugged into contacts 10.

Figure 8:
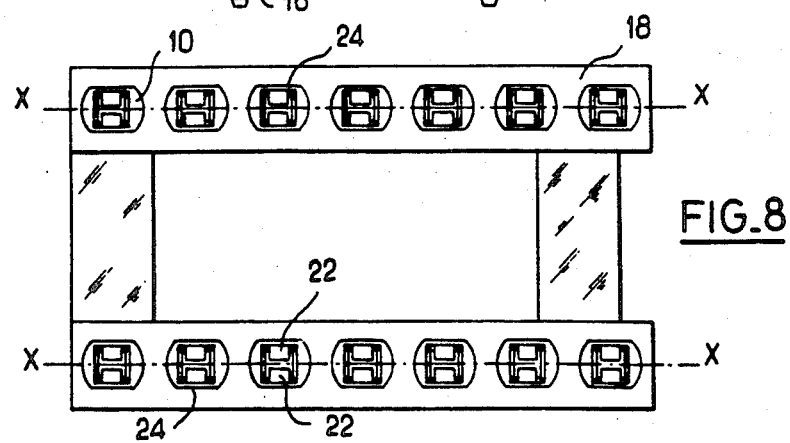
FIG. 8 is a plan view of the insulating block ready to receive the tabs of an integrated circuit.

FIG. 8 shows the orientation of the tulip contacts 10 in the insulating block 18 (before insertion of the integrated circuit legs). The thin walls 24 of the body 12 are parallel to one another and extend parallel to the longitudinal axis X—X of the support 18 so that the ends of the tabs 22 will cooperate with the faces of legs 42 whose long side extends between the said ends. The openings in which the tabs 22 are sheared have an axial dimension that is less than the thickness of the insulating block 18. When the tulip contacts are inserted in this block, any contamination of the contact part by solder flux is impossible. For this purpose, it is necessary that the base of the opening adjacent to wall 24 in which tab 22 has been cut, on the side toward the bottom 14, be in tight contact with the lower portion of the support 18. Thus, such openings do not extend for the full thickness of insulating block 18 when the contact is inserted into the block. The seal between the tubular body 12 at the level of the upper portion of support 18, substantially in the plane of the bevel 32, need not be similarly of a tight fit.

Before its insertion, the tulip contact can easily be treated by electrodeposition, such as with gold or tin lead, due to the presence of the openings corresponding to the stamped out tabs 22.

What is claimed is:

1. An electrical contact of the tulip type for supporting an integrated circuit or similar component and comprising a tubular body having a closed end forming a bottom, said bottom being connected to a terminal provided to electrically cooperate with a hole of a printed circuit board and an open end of which is provided to receive a leg of said component which cooperates with a spring providing the electrical contact, characterized in that the tubular body is obtained by cold forming and comprises two parallelly extending walls having a small thickness through which are punched two tabs of substantially rectangular shape extending to face one another and converging towards the bottom of the body, the walls of small thickness being connected by walls having a larger thickness.

2. The electrical contact of claim 1, wherein the bottom of said tubular body has opposite surfaces of reduced thickness and formed as flat portions.

3. The electrical contact of claim 1, including beveled walls adjacent said open end of said tubular body.

4. The electrical contact of claim 1, wherein the walls from which said tabs are punched are provided with beveled surfaces.

5. The electrical contact of claim 1, characterized in that said body has substantially rectangular openings which result from punching out of said tabs, the longitudinal dimension of said openings along the length of said contact being less than the thickness of an insulating block in which said contact is adapted to be received.

6. A support for receiving an integrated circuit or similar component, said support comprising an insulating block having at least one row of tulip type contacts inserted therein in a longitudinal direction, each of said contacts comprising a tubular body prolonged by a terminal adapted to electrically cooperate with a hole in a printed circuit board, said body having an open end adapted to receive a leg of said component, characterized in that each of said tulip type contacts comprises two parallelly extending walls having a small thickness through which are punched two tabs of substantially rectangular shape extending to face one another and converging towards the bottom of said body, the walls of small thickness being connected by walls having a larger thickness, each of said contacts being oriented in said insulating block with its thinner walls parallel to the longitudinal axis of said insulating block, whereby said contacts are adapted to receive rectangular shaped legs of said component in a manner such that said legs also extend parallel to said longitudinal axis.

7. The support of claim 6, wherein said body has substantially rectangular openings which result from punching out of said tabs, the longitudinal dimension of said openings along the length of said contacts being less than the thickness of said insulating block, whereby a tight seal between said contact and said block is achieved.

8. The support of claim 7, including beveled walls adjacent said open end of said tubular body.

9. The support of claim 8, wherein the walls from which said tabs are punched are provided with beveled surfaces.

10. The support of claim 9, wherein the bottom of said tubular body has opposite surfaces of reduced thickness and formed as flat portions.

* * * * *